United States Patent [19]

Desai et al.

[11] Patent Number: 5,159,535
[45] Date of Patent: Oct. 27, 1992

[54] METHOD AND APPARATUS FOR MOUNTING A FLEXIBLE FILM SEMICONDUCTOR CHIP CARRIER ON A CIRCUITIZED SUBSTRATE

[75] Inventors: Kishor V. Desai, Vestal; Nelson P. Franchak, Binghamton; Robert H. Katyl, Vestal; Harold Kohn, Endwell; Tamar A. Sholtes, Endicott; Vilakkudi G. Veeraraghavan, Endicott; Charles G. Woychik, Endicott, all of N.Y.

[73] Assignee: International Business Machines Corporation, Armonk, N.Y.

[21] Appl. No.: 365,326

[22] Filed: Jun. 13, 1989

Related U.S. Application Data

[63] Continuation of Ser. No. 24,499, Mar. 11, 1987, abandoned.

[51] Int. Cl.⁵ .............................................. H05K 5/00
[52] U.S. Cl. ..................................... 361/398; 361/411; 361/412
[58] Field of Search ...................... 361/398, 411, 412

[56] References Cited

U.S. PATENT DOCUMENTS

| | | | |
|---|---|---|---|
| 3,292,240 | 12/1966 | McNutt et al. | |
| 3,303,393 | 2/1967 | Hymes et al. | 361/411 |
| 3,312,325 | 4/1967 | Beck et al. | 198/33 |
| 3,320,658 | 5/1967 | Bolda et al. | 228/180.2 |
| 3,339,704 | 9/1967 | Clark et al. | 198/33 |
| 3,367,476 | 2/1968 | Aronstein et al. | 198/33 |
| 3,373,481 | 3/1968 | Lins et al. | 29/471.3 |
| 3,387,365 | 6/1968 | Stelmak et al. | 29/628 |
| 3,392,442 | 7/1968 | Napier et al. | 29/628 |
| 3,461,357 | 8/1969 | Mutter et al. | 317/234 |
| 3,646,670 | 3/1972 | Macda et al. | 29/627 |
| 3,780,352 | 12/1973 | Redwanz | 361/398 X |
| 3,795,047 | 3/1974 | Abolafia et al. | 361/412 X |

(List continued on next page.)

FOREIGN PATENT DOCUMENTS 2014202 4/1970 France.

OTHER PUBLICATIONS

"CCMD provides reliable assembly of chip carriers to PCBs", Materials Engineering, p. 43, (Nov. 1984), and Raychem Chip Carrier Mounting Device (CCMD) Specifications (not dated).

(List continued on next page.)

Primary Examiner—Leo P. Picard
Assistant Examiner—Lincoln Donovan
Attorney, Agent, or Firm—Pollock, Vande Sande & Priddy

[57] ABSTRACT

Method and apparatus are disclosed for mounting a flexible film semiconductor chip carrier on a second level electronic package. The resulting electronic packaging structure includes electrically conductive spacers, such as solder balls or solder coated copper balls, which electrically interconnect outer lead bonding pads on the flexible film semiconductor chip carrier and corresponding bonding pads on the second level electronic package, and which physically support the flexible film of the semiconductor chip carrier substantially in a plane above the surface of the second level electronic package. This electronic packaging structure is made using a special assembly fixture comprising a base plate, a pressure insert with a resilient member, and a top plate. The flexible film semiconductor chip carrier with the spacers attached thereto is placed over the resilient member of the pressure insert which is clamped together with the second level electronic package between the top and base plates. Then, this assembly is heated to reflow the solder of the spacers, and the assembly fixture is disassembled, leaving the flexible film semiconductor chip carrier mounted on the second level electronic package with the flexible film of the carrier having a planar geometry as desired. The spacers may be attached to the flexible film semiconductor chip carrier using a special template having a pattern of openings corresponding to the pattern of outer lead bonding pads on the flexible film semiconductor chip carrier.

12 Claims, 4 Drawing Sheets

U.S. PATENT DOCUMENTS

| | | | |
|---|---|---|---|
| 3,871,015 | 3/1975 | Lin et al. | 357/67 |
| 4,231,154 | 11/1980 | Gazdik et al. | 29/840 |
| 4,251,852 | 2/1981 | Ecker et al. | 361/386 |
| 4,329,779 | 5/1982 | England | 29/840 |
| 4,377,316 | 3/1983 | Ecker et al. | 339/17 CF |
| 4,480,288 | 10/1984 | Gazdik et al. | 361/398 |
| 4,512,509 | 4/1985 | Ellis, Jr. et al. | 228/180.2 |
| 4,517,051 | 5/1985 | Gazdik et al. | 156/644 |
| 4,549,200 | 10/1985 | Ecker et al. | 357/80 |
| 4,628,408 | 12/1986 | Kimura | 361/398 X |
| 4,642,889 | 2/1987 | Grabbe . | |
| 4,681,654 | 7/1987 | Clementi et al. | 361/398 |
| 4,692,843 | 9/1987 | Matsummoto et al. | 361/414 |

OTHER PUBLICATIONS

Gazdik, et al., "Processing PC Conductor Decals", *IBM Technical Disclosure Bulletin,* vol. 21, No. 11, Apr. 1979, p. 4425, (International Business Machines Corporation, Armonk, N.Y., 10504).

D. P. Seraphim and I. Feinberg, Electronic Packaging Evoluation in IBM, *IBM Journal of Research and Development,* vol. 25, No. 4, Sep. 1981, p. 620, (published by International Business Machines Corporation, Armonk, N.Y. 10504).

Neues Aus Der Technik, No. 3/4, Aug. 15 1984, p. 2, Würzburg, DE; "Elektrisch-elektronische Einzelteile".

METHOD AND APPARATUS FOR MOUNTING A FLEXIBLE FILM SEMICONDUCTOR CHIP CARRIER ON A CIRCUITIZED SUBSTRATE

This application is a continuation of Ser. No. 07/024,499 filed on Mar. 11, 1987 now abandoned.

BACKGROUND OF THE INVENTION

The present invention relates to electronic packaging, and more particularly relates to a method and apparatus for mounting a flexible film semiconductor chip carrier on a circuitized substrate such as a printed circuit card or board.

Typically, one or more semiconductor chips, or other such electronic devices, are mounted on a first circuitized substrate (called a semiconductor chip carrier, or, more generally, a first level electronic package), which, in turn, is mounted on a second circuitized substrate, such as a printed circuit card or board (more generally called a second level electronic package). The electronic device(s) mounted on the first level electronic package are electrically connected through the circuitry of the first level package to the circuitry of the second level electronic package. The resulting structure may be used as part of a computer or other such equipment.

A particularly versatile first level electronic package is a flexible film semiconductor chip carrier, for example, as described in U.S. patent application Ser. No. 865,316, entitled "Flexible Film Semiconductor Chip Carrier", which was filed in the United States Patent and Trademark Office on May 21, 1986, which issued as U.S. Pat. No. 4,681,654 on Jul. 21, 1987, and which is assigned to International Business Machines (IBM) Corporation as is the present patent application. Also, see U.S. patent application Ser. No. 009,981, entitled "Full Panel Electronic Packaging Structure and Method of Making Same", which was filed in the United States Patent and Trademark Office on Feb. 2, 1987, and which is also assigned to IBM Corporation. (The entire disclosures of these two United States patent applications are incorporated herein by reference.) This type of first level electronic package comprises a circuitized, flexible substrate, such as a relatively thin sheet of polyimide having a thickness between approximately 5.1 to 7.6 micrometers (about 0.0002 to 0.0003 inch) and having circuitry formed on at least one side of the polyimide sheet. A semiconductor chip, or other such electronic device, may be mounted on pads, such as controlled collapse chip connection (C-4) pads, which are part of the circuitry formed on the polyimide sheet, and then the resulting structure may be mounted on a printed circuit board, or other such second level electronic package.

Conventional techniques such as solder reflow, ultrasonic bonding, or thermal compression bonding may be used to mount the flexible film semiconductor chip carrier on the second level electronic package with the semiconductor chip backbonded to the second level package. However, each of these techniques results in a non-planar ("tent") geometry for the circuitized, flexible film carrying the semiconductor chip, when the flexible film semiconductor chip carrier is mounted on the second level electronic package. Such a tent geometry for the circuitized, flexible film raises reliability concerns because stresses may be imposed on the circuitry on the flexible film, or on joints, such as C-4 joints between the semiconductor chip and C-4 pads on the flexible film, during the process of mounting the film on the second level electronic package, or during subsequent use of the resulting electronic packaging structure. In addition, such a tent geometry for the circuitized, flexible film presents problems such as difficulty in aligning outer bonding pads on the flexible film with mating pads on the second level package, difficulty in making sufficiently strong bonds between the flexible film and the second level package to hold the flexible film in position and prevent it from springing up, difficulty in preventing electrical shorting between the circuitry on the flexible film and the edges of the semiconductor chip over which the film is draped, and difficulty in adequately cleaning under the film once it is in position on the second level electronic package.

A planar geometry for the circuitized, flexible film is very desirable since it eliminates or alleviates the foregoing concerns and problems, and one solution is to provide a cavity in the second level electronic package which accommodates the semiconductor chip mounted on the circuitized, flexible film, thereby allowing the flexible film to assume the desired planar geometry. However, this solution is not particularly desirable since, for example, it decreases the wireability of the second level package. Also, placing the semiconductor chip in a cavity presents a flux cleaning problem.

SUMMARY OF THE INVENTION

Therefore, it is an object of the present invention to provide an electronic packaging structure wherein a flexible film semiconductor chip carrier is mounted on a second level electronic package such that the circuitized, flexible film of the carrier is substantially planar when mounted on the second level electronic package, without providing a cavity in the second level package.

Also, it is an object of the present invention to provide a method and apparatus for simple and reliable mounting of a flexible film semiconductor chip carrier on a second level electronic package such that the circuitized, flexible film of the carrier is substantially planar when mounted on the second level electronic package, without providing a cavity in the second level electronic package.

These and other objects of the present invention are attained by positioning an electrically conductive spacer between each outer lead bonding pad on a flexible film semiconductor chip carrier and a corresponding (matching) bonding pad on a second level electronic package on which the carrier is to be mounted. Each spacer has a height approximately equal to the height of the semiconductor chip, or other such electronic device, which is to be mounted on the flexible film. Thus, the spacers physically support the flexible film substantially in a plane above the surface of the second level electronic package, as desired, when the flexible film semiconductor chip carrier is mounted on the second level electronic package with the semiconductor chip backbonded to the surface of the second level electronic package. Also, the spacers electrically connect the outer lead bonding pads of the circuitry on the flexible film to the mating bonding pads on the second level electronic package.

Preferably, the spacers are metal balls, such as solder balls or solder coated copper balls, which are positioned on the outer lead bonding pads of the circuitry on the flexible film using a special template, and then bonded to these pads by heating the metal (solder) to its melting temperature followed by cooling the metal (solder) to a temperature, such as room temperature, to solidify the metal (solder) and bond it to the pads. Then, the flexible film semiconductor chip carrier with the spacers is mounted on the second level electronic package using a special assembly fixture comprising a base plate having locating pins and clamping studs extending out from one surface of the plate, a pressure insert with clearance holes and an opening for accommodating the flexible film semiconductor chip carrier, and a top plate with clearance holes through which the clamping studs of the base plate may pass. The pressure insert is placed on the base plate with selected locating pins on the base plate extending through the clearance holes on the pressure insert. Then, the flexible film semiconductor chip carrier is placed over the opening in the pressure insert with the selected locating pins on the base plate extending through a frame, or other such structure, for handling and positioning the carrier. After the flexible film semiconductor chip carrier is in position on the pressure insert, the second level electronic package is placed on top of the carrier with other selected locating pins on the base plate extending through locating holes in the second level package. Then, the top plate is placed over the second level electronic package with the clamping studs on the bottom plate passing through the clearance holes of the top plate, and the top plate and bottom plate are clamped together using the clamping studs. This entire assembly is then heated, for example, by placing it in a vapor phase solder reflow machine, to reflow the solder of the spacers and thereby mount the flexible film semiconductor chip carrier on the second level electronic package. The assembly fixture may then be disassembled leaving the flexible film semiconductor chip carrier mounted on the second level electronic package with the flexible film of the carrier having a planar geometry as desired.

BRIEF DESCRIPTION OF THE DRAWING

Other objects and advantages of the present invention will be apparent from the following description in conjunction with the accompanying drawing, in which like reference numerals identify like elements, and in which:

FIG. 1b is an expanded view of the highlighted portion of FIG. 1a.

DESCRIPTION OF THE PREFERRED EMBODIMENT

Figure 1B:
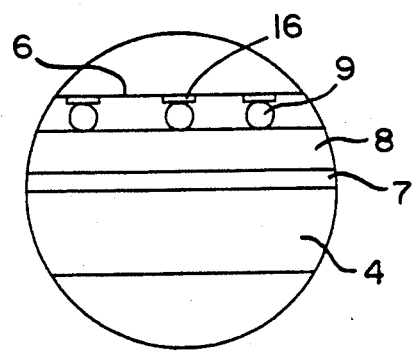
Figure 1A:
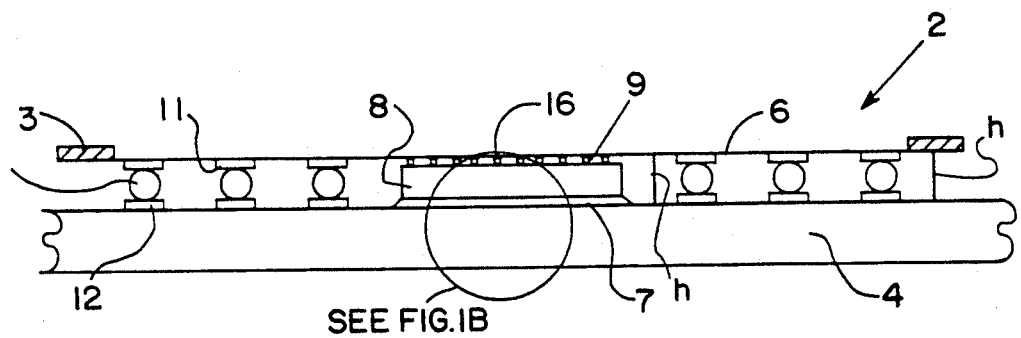
FIG. 1a is a cross-sectional view of a flexible film semiconductor chip carrier mounted on a printed circuit board according to the principles of the present invention.

Referring to FIG. 1, a cross-sectional view is shown of a flexible film semiconductor chip carrier 2 mounted on a printed circuit board 4 to form an electronic packaging structure according to the principles of the present invention. As shown in FIG. 1, the flexible film semiconductor chip carrier 2 comprises a frame 3 holding a flexible film 6 with circuitry (not shown) on at least one side of the film 6. A semiconductor chip 8 is mounted on the carrier 2 and backbonded to the printed circuit board 4. As shown in FIG. 1, controlled collapse chip connections (C-4's) 9 are used to mount the semiconductor chip 8 on inner lead bonding pads 16 of the circuitry (not shown) on the flexible film 6 of the flexible film semiconductor chip carrier 2. The semiconductor chip 8 is backbonded to the circuit board 4 using an interposer 7 made of a material, such as a metal, for facilitating heat transfer between the semiconductor chip 8 and the circuit board 4, and for alleviating thermal coefficient of expansion mismatches between the chip 8 and the circuit board 4. Electrically conductive spacers 10 between outer lead bonding pads 11 of the circuitry on the flexible film 6 and bonding pads 12 of the circuitry on the circuit board 4, physically support the flexible film 6 substantially in a plane above the surface of the circuit board 4, and electrically interconnect the outer lead bonding pads 11 of the circuitry on the flexible film 6 and the bonding pads 12 of the circuitry on the circuit board 4.

The printed circuit board 4 may be made in any one of a number of different ways, and may be composed of combinations of a number of different materials. For example, the printed circuit board 4 may be made of layers of glass cloth impregnated with epoxy resin or other such dielectric material, with circuitry (not shown) formed on the top surface of the board 4 and/or between the layers of dielectric material making up the board 4. Preferably, at least one layer of the printed circuit board 4 is a ground plane (not shown) providing a ground return for the wires (circuit lines) on the circuitized, flexible film 6 of the flexible film semiconductor chip carrier 2 which is mounted on the printed circuit board 4.

Basically, the printed circuit board 4 may have virtually any desired size and shape, as long as there is at least one area on the board 4 suitable for mounting the flexible film semiconductor chip carrier 2 on the printed circuit board 4.

Preferably, the area on the printed circuit board 4 for mounting the flexible film semiconductor chip carrier 2 on the printed circuit board 4 is a substantially planar area. Also, it should be noted that although the present invention is described with respect to mounting the flexible film semiconductor chip carrier 2 on a printed circuit board 4, the present invention is broadly directed to mounting the flexible film semiconductor chip carrier 2 (first level electronic package) on virtually any second circuitized substrate (second level electronic package).

Further, it should be noted that although the present invention is described with respect to the flexible film semiconductor chip carrier 2 carrying a semiconductor chip 8, the carrier 2 may carry any one, or a plurality, of a number of different electronic devices, such as resistors and/or capacitors, in addition to, or in lieu of, the semiconductor chip 8. Further, it should be noted that, as shown in FIG. 1, preferably, the semiconductor chip 8 is mounted on the flexible film semiconductor chip carrier 2 using controlled collapse chip connections (C-4's) 9. However, if desired, the semiconductor chip 8, and/or other electronic devices, may be mounted on the flexible film semiconductor chip carrier 2 by using a thermal compression bonding technique, or other such technique.

Preferably, the circuitry on the printed circuit board 4 comprises copper circuit lines each approximately 76.2 micrometers wide (about 0.003 inch), and having a height (thickness) of approximately 35.6 micrometers (about 0.0014 inch). However, it should be noted that the width and thickness of the circuit lines may vary depending on factors such as the capabilities of the process used to form the circuitry on the printed circuit board 4, the planned use for the circuitry, and the performance characteristics expected of the circuitry and of the overall electronic packaging structure.

As mentioned previously, the interposer 7 is provided for facilitating heat transfer between the semiconductor chip 8 and the circuit board 4, and for alleviating thermal coefficient of expansion mismatches between the chip 8 and the circuit board 4. For example, if the semiconductor chip 8 is made primarily of a material such as silicon, and the circuit board 4 is made primarily of a material such as glass cloth impregnated with epoxy resin, then the interposer 7 may be made of a metal, such as a copper clad "INVAR" material sold by Texas Instruments, Inc. having a place of business in Dallas, Tex., which has a coefficient of thermal expansion between the coefficient of thermal expansion of silicon and the coefficient of thermal expansion of glass cloth impregnated with epoxy resin. Thus, the copper clad "INVAR" material of the interposer 7 would act as a thermal coefficient of expansion "bridge" between the silicon of the semiconductor chip 8 and the glass cloth impregnated with epoxy resin of the circuit board 4, to alleviate the thermal coefficient of expansion mismatch between the chip 8 and the circuit board 4. Also, the interposer 7 facilitates rework if the interposer 7 is attached to the surface of the printed circuit board 4 by soldering, since the semiconductor chip 8, and the interposer 7, can be easily removed from the surface of the printed circuit board 4 by heating.

The interposer 7 may be attached to the semiconductor chip 8, using thermally conductive epoxy, before the flexible film semiconductor chip carrier 2 is mounted on the printed circuit board 4. Then, the interposer 7 may be attached to the printed circuit board 4 by soldering, at the same time the flexible film semiconductor chip carrier 2 is mounted on the circuit board 4.

However, it should be noted that, in certain situations, it may be desirable to backbond the semiconductor chip 8 directly to the surface of the printed circuit board 4, without using the interposer 7. For example, if the printed circuit board 4 is made of a material(s) having a coefficient of thermal expansion which closely matches the coefficient of thermal expansion of the semiconductor chip 8 which is to be backbonded to the circuit board 45, and rework requirements are not of great concern, then it may be desirable to backbond the semiconductor chip 8 directly to the surface of the printed circuit board 4 by soldering, by using a thermally conductive epoxy, or by using another such suitable technique.

Figure 2:
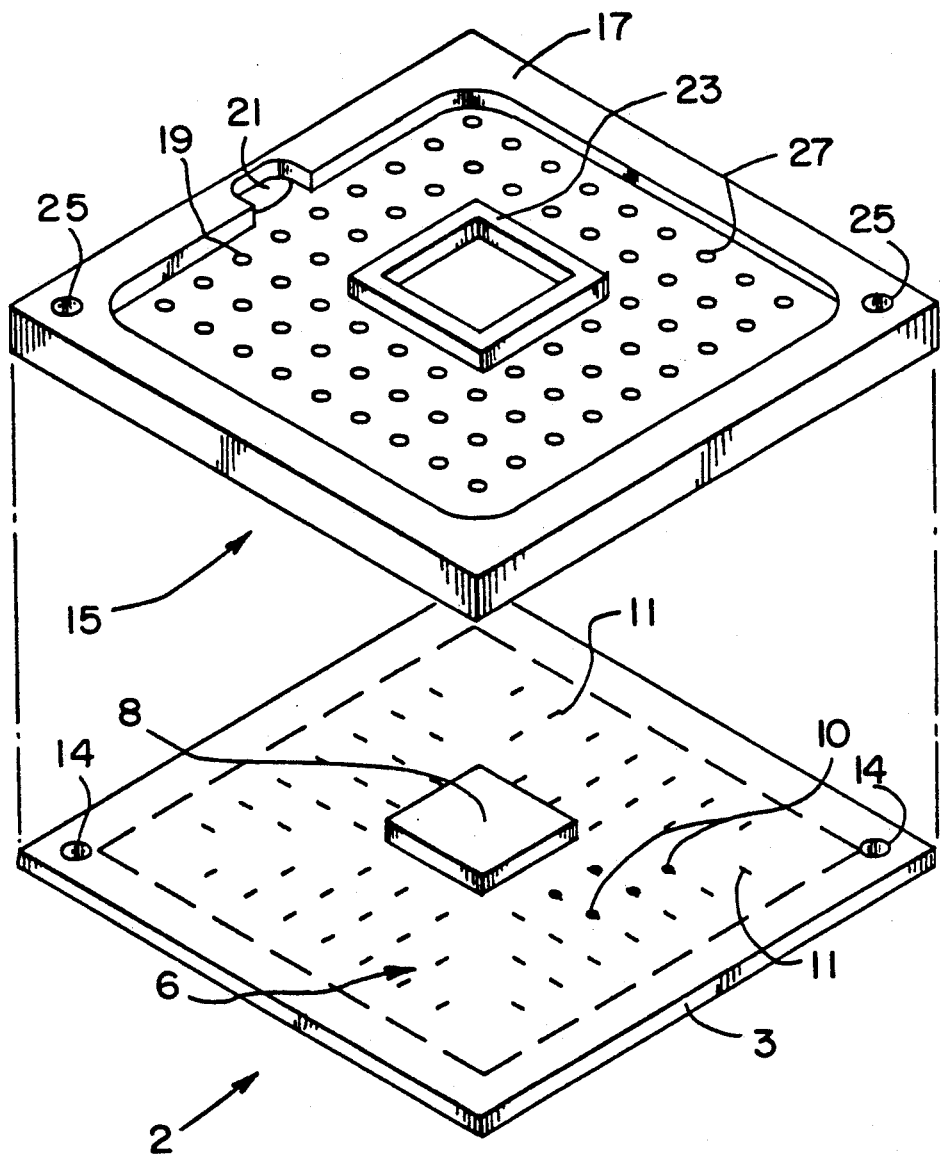
FIG. 2 is a perspective view of a template for placing solder ball spacers and/or a semiconductor chip on a flexible film of a flexible film semiconductor chip carrier, according to the principles of the present invention.

As best shown in FIG. 2, the frame 3 is a square, ring like structure, attached to the edges of the flexible film 6 of the flexible film semiconductor chip carrier 2, and includes locating holes 14 for registration of the flexible film 6 during manufacture of the flexible film 6 on the frame 3, and during mounting of the flexible film semiconductor chip carrier 2 on the printed circuit board 4. If desired, slots or notches in the frame 3, or other such means, may be used to perform this registration. The frame 3 has dimensions compatible with the dimensions of the flexible film 6. For example, if the flexible film 6 is approximately a 44.1 millimeter (about 1.735 inch) square, then the frame 3 may be a square ring having an approximately 44.1 millimeters (about 1.735 inches) square outside edge, a height (thickness) of approximately 1.6 millimeters (about 0.062 inch), and a frame width of virtually any dimension which, preferably, does not overlap any of the circuitry on the flexible film 6 of the flexible film semiconductor chip carrier 2. The primary function of the frame 3 is to facilitate handling of the flexible film semiconductor chip carrier 2 during its manufacture and during the mounting of the carrier 2 on the circuit board 4. Preferably, after the flexible film semiconductor chip carrier 2 is mounted on the printed circuit board 4, the frame 3 is removed from the flexible film 6, for example, by cutting the frame 3 away from the flexible film 6. This prevents potential movements of the frame 3 from adversely affecting the inner lead bonds between the semiconductor chip 8 and the circuit board 4, and the outer lead bonds (spacers 10) between the flexible film 6 and the circuit board 4 after the flexible film semiconductor chip carrier 2 has been mounted on the circuit board 4. Of course, if the frame 3 is so small (thin) that its potential movement is not of concern relative to the integrity of the inner and/or outer lead bonds, then it may not be necessary to remove the frame 3. Also, if there is some further purpose which the frame 3 may serve after the flexible film semiconductor chip carrier has been mounted on the circuit board 4, then the frame 3 may be left in place, if desired.

Although the frame 3 has been shown as a ring like structure in FIGS. 1-4, the frame 3 may have any one of a number of different configurations, and may be made of any one of a number of different materials, or combinations of different materials. Basically, the frame 3 should have the following characteristics. It should be substantially chemically inert to chemicals which may be used in expose, develop, etch, clean, or other such processes, used in forming the circuitry on the flexible film 6. Also, the frame 3 should be rigid, or semi-rigid, in the sense that it will lay substantially flat on a planar surface such that all of its perimeter is effectively in contact with the planar surface. In addition, the frame 3 should be able to withstand bonding temperatures which may be reached when bonding the spacers 10 to the outer lead bonding pads 11 of the circuitry on the flexible film 6, or to the outer lead bonding pads 12 of the circuitry on the printed circuit board 4. Finally, the frame 3 should be able to withstand chip joining process temperatures which may be reached when joining the semiconductor chip 8, or other such electronic device(s), to inner lead bonding pads 16 of the circuitry on the flexible film 6.

For example, the frame 3 may comprise a square, or rectangular, ring like structure made of relatively thin aluminum having a thickness, for example, of between approximately 50.8 micrometers (about 0.002 inch) and 177.8 micrometers (about 0.007 inch). This relatively thin aluminum comprising the frame 3 may be a portion of a temporary full panel, planar aluminum support on which the circuitized, flexible film 6 is first made, and which has been removed except for that part of the aluminum support which is to remain as the frame 3. For example, the undesired portion of the aluminum support may have been removed by etching away the aluminum in hydrochloric acid with a photoresist, or other such, mask protecting that part of the aluminum support which is to remain as the frame 3. Alternatively, the frame 3 may comprise a square, or rectangular, ring like structure made of relatively thin aluminum, as described above, mounted on a thicker matching ring structure of titanium. For example, the titanium may have a thickness of approximately 1.6 millimeters (about 0.062 inch). The relatively thin aluminum ring like structure may be mounted on the thicker titanium ring like structure by adhesive lamination. This combination aluminum-titanium structure may be preferred in certain situations since the coefficient of thermal expansion of titanium is compatible with glass cloth impregnated with epoxy resin, or other such material, which is likely to be the primary material comprising the circuit board 4. However, as noted previously, the frame 3 may be made of any one of a number of different materials, or combinations of different materials, including materials such as stainless steel, copper, polysulfone, and/or polyimide material such as the polyimide material sold under the trademark "KAPTON" by E. I. Du Pont de Nemours and Company having a place of business at 1007 Market Street, Wilmington, Del.

Preferably, the flexible film 6 comprises a relatively thin sheet of polyimide having a thickness, for example, between approximately 5.1 to 7.6 micrometers (about 0.0002 to 0.0003 inch), and having circuitry formed on at least one side of the polyimide sheet, for example, as described in U.S. patent application Ser. No. 865,316, entitled "Flexible Film Semiconductor Chip Carrier", which was filed in the United States Patent and Trademark Office on May 21, 1986, which issued as U.S. Pat. No. 4,681,654 on Jul. 21, 1987, and which is assigned to International Business Machines Corporation as is the present patent application. However, it should be noted that depending on the product which it is desired to produce, the application for that product, and other such factors, it may be desirable to use material(s) other than polyimide for the flexible film 6.

For most applications, when using a polyimide sheet as the flexible film 6, the polyimide sheet should have a thickness less than approximately 12.7 micrometers (about 0.0005 inch) to provide stress relief during thermal cycling of the polyimide when manufacturing and using the electronic packaging structure according to the principles of the present invention. This polyimide sheet may have a length and width of any dimensions which can be handled in the process used to manufacture the flexible film semiconductor chip carrier 2. However, the polyimide should not be so thin that it loses its structural integrity such that it cannot function as a structurally continuous dielectric layer. For some applications, it may be desirable for the polyimide sheet to have a thickness between approximately 12.7 and 25.4 micrometers (about 0.0005 and 0.001 inch). However, to provide the thermal stress relief mentioned previously, especially when using controlled collapse chip connections (C-4's) 9 between the semiconductor chip 8 and the inner lead bonding pads 16 of the circuitry on the flexible film 6, it is preferred that the polyimide not have a thickness greater than approximately 25.4 micrometers (about 0.001 inch). When using other types of interconnections between the semiconductor chip 8 and the inner lead bonding pads 16 of the circuitry on the flexible film 6, it may be feasible, and desirable, in certain situations, to use a thicker sheet of polyimide as the flexible film 6. For example, if a thermal compression bonding technique is used to make the interconnections between the semiconductor chip 8 and the inner lead bonding pads 16 of the circuitry on the flexible film 6, then the polyimide sheet forming the flexible film 6 may have a thickness of up to approximately 127.0 micrometers (about 0.005 inch).

The polyimide forming the flexible film 6 may be any one of a number of specific materials. For example, "5878" polyimide, which is a polymer formed from the monomers pyromellitic dianhydride and oxydianiline (commonly referred to as "PMDA-ODA"), available from E. I. Du Pont de Nemours and Company, may be used. This "5878" polyimide is a thermo set condensation polymer polyimide, which is basically a high temperature, elastic material. That is, it is capable of withstanding processing temperatures up to approximately four-hundred degrees centigrade, and may be stretched.

Preferably, the circuitry (not shown) on the flexible film 6 is relatively fine line circuitry with the individual circuit lines having a height (thickness) of approximately 7.6 micrometers (about 0.0003 inch) and a width of approximately 25.4 micrometers (about 0.001 inch). However, it should be noted that the thickness and width of the circuit lines may vary depending on factors such as the capabilities of the process used to form the circuitry on the flexible film 6, the planned use for the circuitry, and the performance characteristics expected of the circuitry and of the overall electronic packaging structure.

Also, preferably, the circuitry on the flexible film 6 comprises a chromium/copper/chromium (Cr/Cu/Cr) metallurgical system which is personalized using photolithographic and etching techniques such as described in U.S. Pat. Nos. 4,231,154, 4,480,288 and 4,517,051, which are assigned to International Business Machines Corporation, Armonk, N.Y., as is the present patent application. The entire disclosures of each of these three United States patents are incorporated herein by reference. The flexible film 6 may have circuitry formed on only one side, or, if desired, the flexible film 6 may have circuitry on both sides with interconnecting vias as described, for example, in the previously noted U.S. Pat. Nos. 4,480,288 and 4,517,051.

Figure 4:
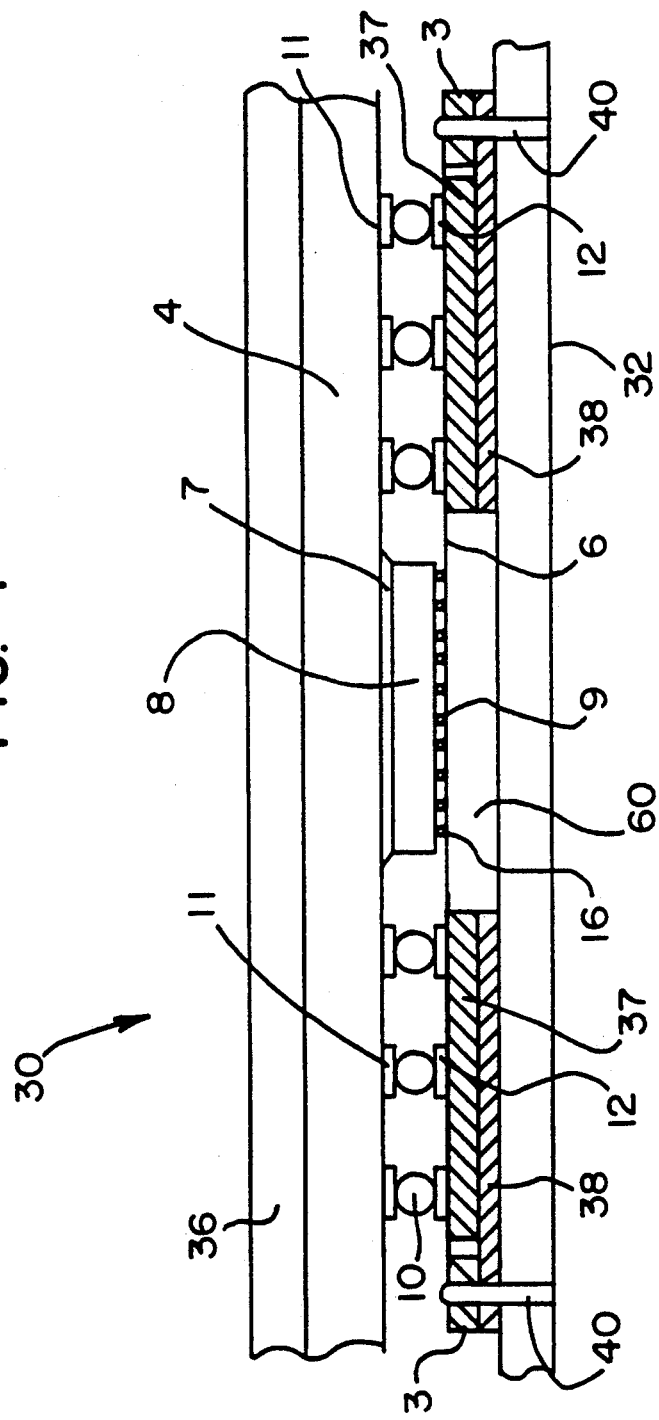
FIG. 4 is a cross-sectional view of the assembly fixture shown in FIG. 3 with a flexible film semiconductor chip carrier and a printed circuit board clamped in the fixture.

As best shown in FIGS. 1 and 4, the circuitry on the flexible film 6 includes the inner lead bonding pads 16 for use in mounting the semiconductor chip 8, or other such electronic device(s), on the flexible film 6, and the outer lead bonding pads 11 for use in mounting the flexible film semiconductor chip carrier 2 on the printed circuit board 4 according to the principles of the present invention. Preferably, each of the outer lead bonding pads 11, and inner lead bonding pads 16, is made of copper, coated with a layer of gold to facilitate the bonding of the spacers 10, and the C-4's 9, to the pads 11 and 16, respectively. However, if desired, for example, for economic, or for other reasons, the pads 11 and 16 may be made of just copper, or they may be made of any one of a variety of other such conductive material(s) which will be readily apparent to one of ordinary skill in the art to which the present invention pertains.

The inner lead bonding pads 16, and the outer lead bonding pads 11, on the flexible film 6, may have virtually any desired size, and/or configuration, such as round, oblong, square, rectangular, etc. The considerations relative to the size and configuration of the bonding pads 11 and 16, are factors such as the intended use (application) for the circuitry on the flexible film 6, compatibility with the manufacturing process used to make the circuitry on the flexible film 6, compatibility with the spacers 10 and C-4's which it is intended to bond to the pads 11 and 16, respectively, and other such factors. Relative to the spacing between the outer lead bonding pads 11, they should be spaced such that the spacers 10 will not touch (electrically short) when the spacers 10 are bonded onto the pads 11. This same consideration regarding spacing also applies to the spacing of the inner lead bonding pads 16 to which the controlled collapse chip connections (C-4's) 9 are made.

Similarly, preferably, each of the outer lead bonding pads 12 of the circuitry on the printed circuit board 4 is made of copper, coated with a layer of gold to facilitate the bonding of the spacers 10 to the pads 12. However, if desired, for example, for economic, or for other reasons, the pads 12 may be made of just copper, or they may be made of any one of a variety of other such conductive material(s) which will be readily apparent to one of ordinary skill in the art to which the present invention pertains. 4

Also, as for the inner lead bonding pads 16, and outer lead bonding pads 11, of the circuitry on the flexible film 6, the outer lead bonding pads 12 of the circuitry on the circuit board 4 may have virtually any desired size, and/or configuration, such as round, oblong, square, rectangular, etc. The considerations relative to the size and configuration of the bonding pads 12 are factors such as the intended use (application) for the circuitry on the circuit board 4, compatibility with the manufacturing process used to make the circuitry on the circuit board 4, compatibility with the spacers 10 which it is intended to bond to the pads 12, and other such factors. Relative to the spacing between the outer lead bonding pads 12, they should be spaced to match the spacing of the outer lead bonding pads 11 on the flexible film 6, and the spacing should be selected (as mentioned above with respect to the spacing of the outer lead bonding pads 11 on the flexible film 6) to ensure that the spacers 10 will not touch (electrically short) when the spacers 10 are bonded onto the pads 12.

As shown in FIGS. 1 and 2, the spacers 10 are spherical balls located between the outer lead bonding pads 11 of the circuitry on the flexible film 6 and the bonding pads 12 of the circuitry on the printed circuit board 4. For example, if each of the bonding pads 11 and 12 is generally rectangular with a width of approximately 254.0 micrometers (about 0.010 inch), and a length of approximately 762.0 micrometers (about 0.030 inch), and the combined height (h) of the semiconductor chip 8 and the interposer 7 is approximately 762.0 micrometers (about 0.030 inch), then each of the spacers 10 may be a generally spherical, electrically conductive ball having a diameter of approximately 762.0 micrometers (about 0.030 inch). However, it should be noted that the spacers 10 may be cylindrical, or have any one of a number of different shapes.

Regardless of the particular shape selected for the spacers 10, the height of each of the spacers 10 is selected to approximately equal the combined height (h) of the semiconductor chip 8 and the interposer 7 used to backbond the semiconductor chip 8 to the printed circuit board 4. In this manner, the flexible film 6 is supported substantially in a plane by the spacers 10, when the flexible film semiconductor chip carrier 2 is mounted on the circuit board 4. As discussed above, this planar geometry for the flexible film 6 is a very important feature of the present invention since it eliminates and/or alleviates many of the concerns and problems associated with a non-planar ("tent") geometry for the flexible film 6.

Also, it should be noted that the spacers 10 may be made of any one of a variety of different materials, or combinations of different materials, such as solder, copper coated with solder, stainless steel, nickel, or other such electrically conductive material(s). For example, each of the spacers 10 may be a generally spherical solder ball made of approximately ninety-five percent lead (Pb) and five percent tin (Sn) by weight, which is bonded to the outer lead bonding pads 12 on the circuit board 4 using a eutectic Pb/Sn solder. Such spacers 10 made of spherical solder balls of approximately 95%-Pb/5%-Sn provide several advantages. For example, the compliancy, thermal reliability, and fatigue life of joints made with the 95%-Pb/5%-Sn solder balls is increased relative to joints, for example, made with copper balls coated with an eutectic Pb/Sn solder. Also, the 95%-Pb/5%-Sn solder balls may be joined to the outer lead bonding pads 11 on the flexible film 6 at the same time the semiconductor chip 8 is mounted on the flexible film 6 using the C-4's 9. In addition, the flexible film semiconductor chip carrier 2, with the 95%-Pb/5%-Sn solder balls and the semiconductor chip 8 mounted on the flexible film 6 of the carrier 2, may be mounted on the printed circuit board 4 by soldering with a lower melting temperature solder so that there is no need to heat the C-4's 9 between the semiconductor chip 8 and the inner lead bonding pads 16 on the flexible film 6, to a temperature which could loosen the C-4's 9 when mounting the chip carrier 2 on the printed circuit board 4. Further, use of 95%-Pb/5%-Sn solder balls as the spacers 10 simplifies rework of the electronic packaging structure after the flexible film semiconductor chip carrier 2 is mounted on the printed circuit board 4 since the 95%-Pb/5%-Sn solder balls will remain attached to the flexible film 6 when the flexible film semiconductor chip carrier 2 is removed from the printed circuit board 4 for rework. This eliminates the need for first removing the flexible film semiconductor chip carrier 2 from the printed circuit board 4 and then removing the material forming the spacers 10 from the printed circuit board 4, which otherwise may be necessary to facilitate the rework if the spacers 10 are made of a material other than 95%-Pb/5%-Sn solder balls. Also, the 95%-Pb/5%-Sn solder balls are relatively inexpensive compared to, for example, solder coated copper balls.

However, for some applications, it may be desirable to use spacers 10 made of material(s) other than 95%-Pb/5%-Sn, such as copper balls coated with a eutectic Pb/Sn solder (37% Pb/63% Sn). For example, the spacers 10 may comprise a generally spherical copper ball having a diameter of approximately 660.4 micrometers (about 0.026 inch), coated with a eutectic Pb/Sn solder having a thickness of approximately 50.8 micrometers (about 0.002 inch). Compared to 95%-Pb/5%-Sn solder balls, such solder coated copper balls have advantages such as higher electrical conductivity, and better dimensional stability. Also, it is easier to make such solder coated copper balls with uniform dimensions than it is to make such 95%-Pb/5%-Sn solder balls with uniform dimensions.

Referring to FIG. 2, a perspective view is shown of a special template 15 for bonding (attaching) the spacers 10 to the outer lead bonding pads 11 on the flexible film 6 of the semiconductor chip carrier 2, according to the principles of the present invention. If desired, the template 15 may also be used to bond (attach) the semiconductor chip 8 to the inner lead bonding pads 16 on the flexible film 6 of the semiconductor chip carrier 2. For ease of illustration, only some of the spacers 10 attached to the outer lead bonding pads 11 of the flexible film 6 are shown in FIG. 2.

As shown in FIG. 2, the template 15 is constructed from a single piece of material, such as titanium or zirconium. However, the template 15 may be constructed in any one of a variety of different ways (for example, a multiple piece construction), and may be made of any of a variety of different material(s), as will be readily apparent to one of ordinary skill in the art to which the present invention pertains. The template 15 includes an outside rim 17, a recessed area 19, an escape hole 21, a locating collar 23, and a pair of locating holes 25. The template 15 is sized and shaped to match the size and shape of the flexible film 6 on which the spacers 10 are to be attached. There is a pattern of holes 27 in the recessed area 19 of the template 15 matching the pattern of the outer lead bonding pads 11 on the flexible film 6 of the flexible film semiconductor chip carrier 2 on which it is desired to attach the spacers 10. Also, the locating collar 23 is designed to locate the semiconductor chip 8 relative to the inner lead bonding pads 16 of the flexible film 6 to facilitate mounting the semiconductor chip 8 on the inner lead bonding pads 16 of the flexible film 6 using the C-4's 9 shown in FIG. 1. Alternatively, the locating collar 23 may simply provide a clearance hole for the semiconductor chip 8 which may be mounted on the flexible film 6 by another method prior to attaching the spacers 10 to the outer lead bonding pads 11 of the flexible film 6 using the template 15 according to the principles of the present invention.

Figure 3:
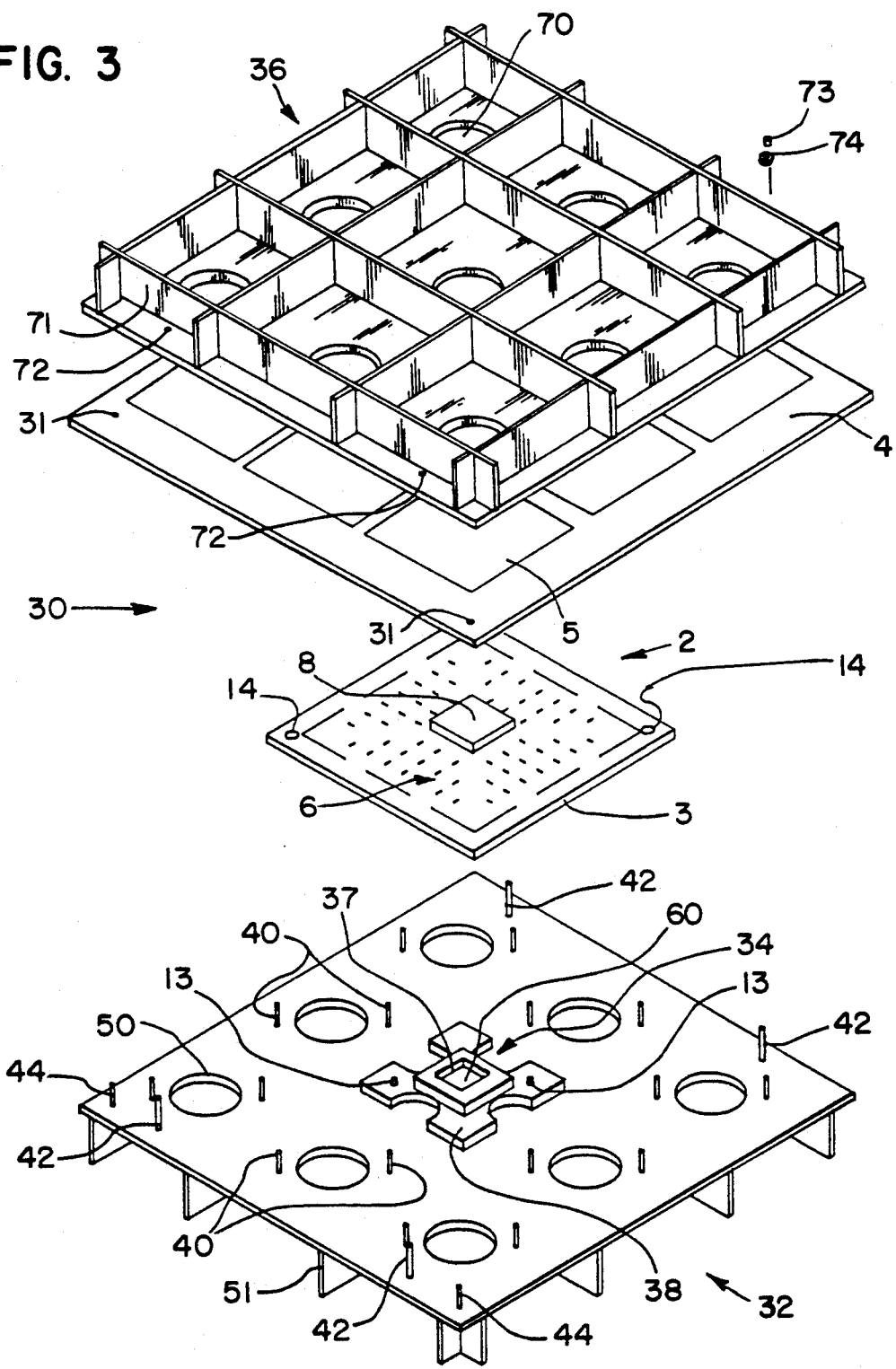
FIG. 3 is an exploded view of a special assembly fixture for mounting a plurality of flexible film semiconductor chip carriers on a second level electronic package according to the principles of the present invention.

Referring to FIG. 3, an exploded, perspective view is shown of an assembly fixture 30 for mounting a three by three matrix of flexible film semiconductor chip carriers 2 on a printed circuit board 4, or other such second level electronic package, having a matching three by three pattern of bonding sites 5, according to the principles of the present invention. For ease of illustration, only one of the flexible film semiconductor chip carriers 2 is shown in FIG. 3. However, it should be understood that, if desired, a flexible film semiconductor chip carrier 2 may be positioned in each of the nine locations of the assembly fixture 30, for mounting at each of the nine matching bonding sites 5 on the printed circuit board 4 shown in FIG. 3. Also, it should be noted that although the assembly fixture 30 shown in FIG. 3 is designed for mounting a three by three matrix of flexible film semiconductor chip carriers 2 on a matching three by three pattern of bonding sites 5 on the printed circuit board 4, the assembly fixture 30 may be designed to mount practically any number of such flexible film semiconductor chip carriers 2 on the printed circuit board 4, or other such second level electronic package, in any one of a number of different patterns.

FIG. 4 is a cross-sectional view of the assembly fixture 30 shown in FIG. 3 with a flexible film semiconductor chip carrier 2 and the printed circuit board 4 clamped in the fixture 30. Again, for ease of illustration, only one semiconductor chip carrier 2 (carrying one semiconductor chip 8) is shown in FIG. 4. However, as discussed previously, it should be understood that several such semiconductor chip carriers 2 may be simultaneously mounted on the printed circuit board 4 using the assembly fixture 30 according to the principles of the subject invention.

As shown in FIGS. 3 and 4, the assembly fixture 30 comprises a base plate 32, a pressure insert, and a top plate 36. As best shown in FIG. 3, the base plate 32 has several pairs of locating pins 40, four clamping studs 42, and two board locating pins 44, all extending out in the same direction from one surface of the base plate 32. For most situations, it is best to make the base plate 32 of a material having a coefficient of thermal expansion which matches the coefficient of thermal expansion of the circuit board 4 which is to be clamped in the assembly fixture 30 with the flexible film semiconductor chip carrier 2. However, if the frame 3 for the flexible film 6 of the semiconductor chip carrier 2 is significantly massive (thick), and has a thermal coefficient of expansion which is significantly different from the thermal coefficient of expansion of the circuit board 4, then it may be desirable to make the base plate 32 of a material having a coefficient of thermal expansion which matches, to the extent possible, the coefficients of thermal expansion of the circuit board 4, and of the frame 3. For example, if the printed circuit board 4 is made primarily of glass cloth impregnated with epoxy resin, and the frame 3 is made of relatively thin aluminum, or of relatively thin aluminum on a titanium base, then the base plate 32 may be made of titanium.

Also, as shown in FIG. 3, preferably, stiffening ribs 51 are attached to the underside of the base plate 32 to ensure that the base plate 32 is substantially flat and that there is contact between the spacers 10 attached to the outer lead bonding pads 11 on the flexible film 6 of semiconductor chip carrier 2, and the outer lead bonding pads 12 on the printed circuit board 4, during the process of mounting the flexible film semiconductor chip carrier 2 on the circuit board 4. The stiffening ribs 51 may be an integral part of the base plate 32, or the ribs 51 may be welded to the underside of the base plate 32, or attached to the base plate 32 in any other such suitable manner. Further, as shown in FIG. 3, to facilitate heat transfer, there are openings 50 in the base plate 32 at each location where it is desired to position a flexible film semiconductor chip carrier 2 for mounting on the printed circuit board 4.

As shown in FIGS. 3 and 4, the pressure insert 34 comprises a "butterfly" shaped base portion with a resilient member 37 supported on top of the base portion 38. Also, there are two locating (clearance) holes 13 in the base portion 38 of the pressure insert 34, which are sized and positioned to fit over one of the pairs of locating pins extending out from the base plate 32. In addition, the pressure insert 34 has an opening 60 sized and positioned to be located beneath the area of the flexible film 6 on which the semiconductor chip 8 is mounted, when the flexible film semiconductor chip carrier 2 is placed on top of the pressure insert 34 in the assembly fixture 30. The opening 60 allows the resilient member 37 of the pressure insert 34 to be in contact with the outer lead bonding area of the flexible film 6 without any contact being made between the pressure insert 34 and the area of the flexible film 6 on which the semiconductor chip 8 is mounted. This prevents the pressure insert 34 from adversely affecting in any way the C-4's 9 between the semiconductor chip 8 and the inner lead bonding pads 16 on the flexible film 6 when the assembly fixture 30 is used in bonding the spacers 10 to the outer lead bonding pads 12 on the circuit board 4, according to the principles of the present invention as described hereinafter.

The base portion 38 of the pressure insert 34 may comprise virtually any rigid material which can support the resilient member 37, and which can withstand the processing temperatures to which the assembly fixture 30 will be subjected. Also, it should be noted that it has been found that it is not necessary for the pressure insert 34 to be made of material(s) having a thermal coefficient of expansion matching either the circuit board 4 or the flexible film semiconductor chip carrier 2. However, in most situations, it will probably be best for the base portion 38 to be made of the same material as the base plate 32.

Preferably, the resilient member 37 of the pressure insert 34 comprises a material such as silicone rubber which rests on top of the base portion 38 of the pressure insert 34. As indicated previously, the resilient member 37 is sized and positioned so that when the semiconductor chip carrier 2 is placed on the pressure insert 34 in the assembly fixture 30, the resilient member 37 will contact the flexible film 6 beneath all of the outer lead bonding areas of the flexible film 6 as best illustrated in FIG. 4. When the spacers 10 are bonded to the outer lead bonding pads 12 using the assembly fixture 30, the presence of the resilient member 37 allows the flexible film 6 with the spacers 10 to move (flex) up and down to ensure contact between each and every one of the spacers 10 and its corresponding outer lead bonding pad 12 even if there are irregularities such as differences in size between individual spacers 10. In effect, the resilient member 37 compensates for dimensional tolerance deviations in the "z-direction" (vertical axis as shown in FIGS. 3 and 4) of the assembly fixture 30 thereby ensuring contact between all the spacers 10 and their corresponding outer lead bonding pads 12 on the circuit board 4, while preventing crushing, or otherwise adversely affecting, the spacers 10 when using the assembly fixture 30 according to the principles of the present invention.

Also, as shown in FIG. 3, preferably, like the base plate 32, the top plate 36 has stiffening ribs 71 attached thereto to ensure that the top plate 36 is substantially flat and that there is contact between the spacers 10 attached to the outer lead bonding pads 11 on the flexible film 6 of semiconductor chip carrier 2, and the bonding pads 12 on the printed circuit board 4, during the process of using the assembly fixture 30 according to the principles of the present invention to mount the carrier 2 on the board 4. Just as for the stiffening ribs 51 which are attached to the underside of the base plate 32, the stiffening ribs 71 on the topside of the top plate 36 may be an integral part of the top plate 36, or the ribs 71 may be welded to the the top plate 32, or attached to the top plate 36 in any other such suitable manner. Further, as shown in FIG. 3, like the base plate 32, to facilitate heat transfer, there are openings 70 in the top plate 36 at each location where is is desired to position a flexible film semiconductor chip carrier 2 for mounting on the printed circuit board 4.

Also, as shown in FIG. 3, the top plate 36 has four clearance holes 72 located and sized so that the four clamping studs 42 on the base plate 32 can pass up through the clearance holes 72 when the top plate 36 and the base plate 32 are brought together to mount the semiconductor chip carrier 2 on the printed circuit board 4, as described hereinafter. As shown in FIG. 3, a nut 73 and a washer 74, or, if desired, other such means, may be used with each clamping stud 42 to aid in holding the top plate 36 and the bottom plate 32 together during the mounting process.

In operation, according to the present invention, when using solder, or solder coated copper balls, as the spacers 10, solder flux, such as a rosin mildly activated flux (RMA flux), first is applied to the outer lead bonding pads 11 on the flexible film 6 of the semiconductor chip carrier 2. Then, the template 15 is placed over the carrier 2 on two locating pins (not shown) with the locating holes 25 in the template 15 aligned with the locating holes 14 in the frame 3 holding the flexible film 6, and with the holes 27 in the recessed area 19 of the template 15 aligned with the outer lead bonding pads 11 on the flexible film 6. Then, the solder ball spacers 10 are poured into the recessed area 19 of the template 15, and pushed into the holes 25, for example, by using a brush (not shown). Excess solder ball spacers 10 are pushed into the escape hole 21 at the edge of the template 15 and are removed from the template 15. Also, either before, during, or after positioning the solder ball spacers 10 in the holes 25, the semiconductor chip 8 is placed in the locating collar 23 of the template 15. Then, this entire assembly is heated, for example, in a conventional solder reflow oven, to reflow the solder ball spacers 10 on the outer lead bonding pads 11 of the flexible film 6, and the C-4's 9 on the semiconductor chip 8, thereby bonding the spacers 10 to the outer lead bonding pads 11, and bonding the C-4's 9 on the semiconductor chip 8 to the inner lead bonding pads 16 (C-4 pads) of the circuitry on the flexible film 6 of the semiconductor chip carrier 2.

After the foregoing reflow operation, the semiconductor chip carrier 2 and the template 15 are cooled, for example, by removing this structure from the reflow oven and allowing the structure to cool to room temperature. Then, the template 15 is removed from the semiconductor chip carrier 2 leaving the solder ball spacers 10 bonded on the outer lead bonding pads 11 of the flexible film 6, and leaving the semiconductor chip 8 bonded to the inner lead bonding pads 16 (C-4 pads) of the flexible film 6. After removing the template 15, the interposer 7 is attached to the top of the semiconductor chip 8 using thermally conductive epoxy as discussed previously.

After removing the template 15 and attaching the interposer 7, the semiconductor chip carrier 2 with the solder ball spacers 10, and the semiconductor chip 8, bonded thereto, is ready for mounting on the printed circuit board 4, or other such second level electronic package, according to the principles of the present invention, using the assembly fixture 30 shown in FIGS. 3 and 4. Alternatively, the the semiconductor chip carrier 2 with the solder ball spacers 10, and the semiconductor chip 8, bonded thereto, may be mounted on the circuit board 4, or other such second level electronic package, using the method and apparatus disclosed in U.S. patent application Ser. No. 024,491 entitled "Removable Holder And Method For Mounting A Flexible Film Semiconductor Chip Carrier On A Circuitized Substrate", which is being filed in the United States Patent and Trademark Office on the same day as the present patent application, and which is assigned to International Business Machines Corporation, as is the present patent application. The entire disclosure of the foregoing patent application is incorporated herein by reference.

The process for mounting the flexible film semiconductor chip carrier 2 with the spacers 10 and the semiconductor chip 8, on the printed circuit board 4, using the assembly fixture 30 shown in FIGS. 3 and 4 according to the principles of the subject invention, is as follows. First, the base plate 32 is placed on a flat surface, with the locating pins 40 and 44, and the clamping studs 42, on the base plate 32 pointing up, away from the flat surface. Then, a pressure insert 34, with a resilient member 37 resting on top of the pressure insert 34, is placed over each pair of locating pins 40 on the base plate 32 where it is desired to mount a flexible film semiconductor chip carrier 2. After the pressure inserts 34 and resilient members 37 are placed in position, a flexible film semiconductor chip carrier 2 is positioned on each of the pressure inserts 34 by passing the locating pins 40 on the base plate 32 up through the locating holes 14 in the frame 3 of the flexible film semiconductor chip carrier 2, with the surface of the carrier 2 carrying the the semiconductor chip 8 facing up, away from the pressure insert 34. Then, the printed circuit board 4 is placed on top of the flexible film semiconductor chip carriers 2, with the two board locating pins 44 on the base plate 32 passing up through corresponding locating holes 31 in the printed circuit board 4 to position each of the bonding sites 5 on the circuit board 4 over its corresponding flexible film semiconductor chip carrier 2. After the printed circuit board 4 is placed in position, the top plate 36 is placed on top of the printed circuit board 4, with the clamping studs 42 of the base plate 32 passing up through the corresponding clearance holes 72 in the top plate 36. Next, a washer 74 and a nut 73 are placed on each of the clamping studs 42, and the nuts 73 are tightened finger tight so that the spacers 10, and the interposers 7 on the tops of the semiconductor chips 8, are brought into contact with the corresponding outer lead bonding pads 12, and the surface of the circuit board 4, respectively, in preparation for mounting the carriers 2 on the circuit board 4, as desired.

After the assembly fixture 30 has been assembled with the flexible film semiconductor chip carriers 2 and the printed circuit board 4 in position as described above, this entire structure is heated to melt solder which has been previously placed (prior to the board 4 being placed in the assembly fixture 30) on the outer lead bonding pads 12 of the circuitry on the printed circuit board 4, and on the locations on the printed circuit board 4 where the interposers 7 are to be bonded. At the same time, the solder on the spacers 10 on the flexible film semiconductor chip carriers 2 is melted thereby bonding the spacers 10 to their corresponding outer lead bonding pads 12 on the printed circuit board 4, and the interposers 7 to the surface of the printed circuit board, as desired. This heating may be done in any one of a number of ways, for example, the assembly fixture 30 with the flexible film semiconductor chip carriers 2 and the printed circuit board 4 clamped therein, may be heated using a conventional vapor phase solder reflow machine. After the spacers 10 have been bonded to the the outer lead bonding pads 12 of the circuitry on the circuit board 4, and the interposers 7 have been bonded to the surface of the circuit board 4, the assembly fixture 30 with the chip carrier 2 and circuit board 4, are cooled, and the assembly fixture 30 is disassembled to remove the printed circuit board 4 with the flexible film semiconductor chip carriers 2 mounted thereon. Then, the frames 3 for the flexible film semiconductor chip carriers 2 may be cut away, or otherwise suitably removed, unless some further use is to be made of the frames 3 after the carriers 2 have been mounted on the circuit board 4, as discussed previously.

Several advantages of the foregoing method and apparatus for mounting flexible film semiconductor chip carriers 2 on a printed circuit board 4, and of the resulting electronic packaging structure, according to the principles of the present invention, should be noted. First, this method and apparatus according to the present invention allows flexible film semiconductor chip carriers 2 to be mounted on the printed circuit board 4 in a planar geometry, rather than in a non-planar ("tent") geometry. As discussed previously, the planar geometry is preferred over a tent geometry for a number of reasons, such as allowing for easier cleaning under the carriers 2 once they are mounted on the board 4, making it easier to align the outer lead bonding pads 11 of the circuitry on the flexible film 6 of the semiconductor chip carriers 2 with the bonding pads 12 of the circuitry on the printed circuit board 4, eliminating undesirable stresses associated with the tent geometry, and eliminating electrical shorting between the carriers 2 and the edges of the semiconductor chips 8. Also, the method and apparatus according to present invention are easy and simple to use, and are suitable for use in a manufacturing environment. In addition, an especially unique feature of the electronic packaging structure described above according to the principles of the present invention, is the closeness of the circuitized, flexible film 6 wiring plane of each semiconductor chip carrier 2, to the printed circuit board 4 which includes the ground return for the wires (circuit lines) on the flexible film 6. That is, the height of the wiring plane of the circuitized, flexible film 6 above the printed circuit board 4 is quite small compared to almost all other semiconductor chip mounting schemes except DCA (direct chip attach). The significance of this is that electronic package inductance is reduced as the "loop" area between a wire (circuit line) and its ground return is reduced. This reduced inductance improves high frequency characteristics of the circuit lines, and increases the number of simultaneous switched circuit lines which can be used, for example, in a digital computer application. Of course, the foregoing features and advantages of the present invention are intended to be an illustrative, and not an exhaustive, list of such features and advantages.

Also, it should be noted that, although the method and apparatus according to the present invention have been described relative to mounting a flexible film semiconductor chip carrier 2 in a planar geometry on a printed circuit board 4, and although this is the preferred way of practicing the present invention, as will be apparent to one of ordinary skill in the art to which the present invention pertains, if desired, the method and apparatus according to the present invention may also be used, without the spacers 10, to mount the flexible film semiconductor chip carrier 2 in a non-planar geometry on the circuit board 4, or other such second level electronic package, by adjusting the size of the spacers 10.

Finally, it should be noted that the foregoing description is directed to one particular embodiment of the present invention and various modifications and other embodiments of the present invention will be apparent to one of ordinary skill in the art to which the present invention pertains. Therefore, while the present invention has been described in conjunction with a particular embodiment it is to be understood that these various modifications and other embodiments of the present invention may be made without departing from the scope of the present invention as described herein and as claimed in the appended claims.

What is claimed is:

1. An electronic packaging structure comprising:
   a circuitized substrate having a pattern of mounting pads thereon;
   a circuitized, flexible film having outer lead bonding pads in a pattern corresponding to the pattern of the mounting pads on the circuitized substrate; and
   spacers electrically interconnecting each of the mounting pads on the circuitized substrate with its corresponding outer lead bonding pad on the circuitized, flexible film, said spacers sized and configured to physically support the circuitized, flexible film substantially in a plane above the surface of the circuitized substrate.

2. An electronic packaging structure as recited in claim 1, further comprising:
   at least one pattern of inner lead bonding pads located on the surface of the circuitized, flexible film facing the circuitized; and
   at least one electronic device mounted on the inner lead bonding pads of the circuitized, flexible film.

3. An electronic packaging structure as recited in claim 2, wherein said electronic device is a semiconductor chip.

4. An electronic packaging structure as recited in claim 1, further comprising:
   at least one pattern of inner lead bonding pads located on the surface of the circuitized, flexible film facing the circuitized substrate;
   at least one electronic device mounted on the inner lead bonding pads of the circuitized, flexible film; and
   a thermally conductive interposer located between the electronic device and the surface of the circuitized substrate.

5. An electronic packaging structure as recited in claim 1, wherein the circuitized substrate comprises a printed circuit board.

6. An electronic packaging structure as recited in claim 1, wherein the circuitized, flexible film comprises a polyimide film semiconductor chip carrier.

7. An electronic packaging structure as recited in claim 6, wherein the polyimide film of the polyimide film semiconductor chip carrier has a thickness between approximately 5.1 micrometers (about 0.0002 inch) and 7.6 micrometers (about 0.0003 inch).

8. An electronic packaging structure as recited in claim 1, further comprising:
   a frame attached to the circuitized, flexible film.

9. An electronic packaging structure as recited in claim 1, wherein at least one of the spacers comprises a solder ball.

10. An electronic packaging structure as recited in claim 9, wherein said solder ball comprises approximately ninety-five percent lead, and five percent tin, by weight.

11. An electronic packaging structure as recited in claim 1, wherein at least one of the spacers comprises a solder coated copper ball.

12. An electronic packaging structure as recited in claim 11, wherein the solder coating on the copper ball comprises approximately thirty-seven percent lead, and sixty-three percent tin, by weight.

* * * * *